(12) United States Patent
Choi et al.

(10) Patent No.: US 12,349,273 B2
(45) Date of Patent: Jul. 1, 2025

(54) PRINTED CIRCUIT BOARD

(71) Applicant: SAMSUNG ELECTRO-MECHANICS CO., LTD., Suwon-si (KR)

(72) Inventors: Seong Ho Choi, Suwon-si (KR); Seong Il Jeon, Suwon-si (KR)

(73) Assignee: SAMSUNG ELECTRO-MECHANICS CO., LTD., Suwon-si (KR)

( * ) Notice: Subject to any disclaimer, the term of this patent is extended or adjusted under 35 U.S.C. 154(b) by 175 days.

(21) Appl. No.: 18/104,531

(22) Filed: Feb. 1, 2023

(65) Prior Publication Data

US 2024/0155764 A1    May 9, 2024

(30) Foreign Application Priority Data

Nov. 9, 2022  (KR) .................... 10-2022-0148696

(51) Int. Cl.
*H05K 1/02* (2006.01)
*H05K 1/03* (2006.01)
*H05K 1/11* (2006.01)

(52) U.S. Cl.
CPC ......... *H05K 1/0298* (2013.01); *H05K 1/0366* (2013.01); *H05K 1/115* (2013.01); *H05K 1/11* (2013.01); *H05K 2201/09827* (2013.01); *H05K 2201/2081* (2013.01)

(58) Field of Classification Search
CPC .... H05K 1/0298; H05K 1/0366; H05K 1/115; H05K 2201/09827; H05K 2201/2081; H05K 1/02; H05K 1/03; H05K 1/0306; H05K 1/09; H05K 3/4655
See application file for complete search history.

(56) References Cited

U.S. PATENT DOCUMENTS

| | | | | |
|---|---|---|---|---|
| 7,565,738 | B2 * | 7/2009 | Usui | H05K 3/4647 |
| | | | | 174/262 |
| 8,003,896 | B2 * | 8/2011 | Wu | H05K 3/4602 |
| | | | | 174/262 |
| 9,538,642 | B2 * | 1/2017 | Ikeda | H05K 3/4676 |
| 9,591,767 | B2 * | 3/2017 | Itoi | H05K 1/186 |
| 10,674,604 | B2 * | 6/2020 | Ishihara | H05K 3/4007 |
| 2016/0021744 | A1 | 1/2016 | Baek et al. | |
| 2021/0014975 | A1 * | 1/2021 | Lin | H05K 3/32 |
| 2023/0397330 | A1 | 12/2023 | Choi et al. | |

FOREIGN PATENT DOCUMENTS

| | | |
|---|---|---|
| JP | 2012-039139 A | 2/2012 |
| KR | 10-2016-0010960 A | 1/2016 |
| KR | 10-2023-0168426 A1 | 12/2023 |

* cited by examiner

*Primary Examiner* — Ishwarbhai B Patel
(74) *Attorney, Agent, or Firm* — MORGAN, LEWIS & BOCKIUS LLP

(57) ABSTRACT

A printed circuit board includes: a first interconnection layer; a first insulating layer covering at least a portion of a side surface of the first interconnection layer; a second insulating layer covering at least a portion of an upper surface of the first interconnection layer and at least a portion of an upper surface of the first insulating layer; a third insulating layer covering at least a portion of a lower surface of the first interconnection layer and at least a portion of a lower surface of the first insulating layer; a second interconnection layer disposed on an upper surface of the second insulating layer; and a third interconnection layer disposed on a lower surface of the third insulating layer.

19 Claims, 8 Drawing Sheets

'A'

PRINTED CIRCUIT BOARD

CROSS-REFERENCE TO RELATED APPLICATION(S)

This application claims benefit of priority to Korean Patent Application No. 10-2022-0148696 filed on Nov. 9, 2022 in the Korean Intellectual Property Office, the disclosure of which is incorporated herein by reference in its entirety.

TECHNICAL FIELD

The present disclosure relates to a printed circuit board.

BACKGROUND

In a printed circuit board having an embedded trace substrate (ETS) structure using a thin material, for example, in the case of using a material containing epoxy and glass, a lack of epoxy may occur near a bottom surface of a copper interconnection due to a physical collision between an embedded copper interconnection and a glass structure, and thus void defects may be caused after lamination.

SUMMARY

An aspect of the present disclosure is to provide a multilayer substrate capable of preventing void defects even when a thin material including glass is used.

One of several solutions suggested through the present disclosure is to apply a first insulating layer after an interconnection is formed on a detach core, and then to reduce a thickness of the first insulating layer by a thinning process, and then to perform a lamination process using second and third insulating layers.

According to an aspect of the present disclosure, a printed circuit board may include: a first interconnection layer; a first insulating layer covering at least a portion of a side surface of the first interconnection layer; a second insulating layer covering at least a portion of an upper surface of the first interconnection layer and at least a portion of an upper surface of the first insulating layer; a third insulating layer covering at least a portion of a lower surface of the first interconnection layer and at least a portion of a lower surface of the first insulating layer; a second interconnection layer disposed on an upper surface of the second insulating layer; and a third interconnection layer disposed on a lower surface of the third insulating layer.

According to an aspect of the present disclosure, a printed circuit board may include: a first interconnection layer; a first insulating layer covering a portion of a side surface of the first interconnection layer and spaced apart from upper and lower surfaces of the first interconnection layer; a second insulating layer disposed on the upper surface of the first insulating layer and t upper surface of the first interconnection layer, and covering at least a portion of the upper surface of the first interconnection layer and the other portion of a side surface thereof; and a third insulating layer disposed on a lower surface of the first insulating layer and the lower surface of the first interconnection layer, and covering at least a portion of the lower surface of the first interconnection layer. The upper surface of the first interconnection layer may protrude onto the upper surface of the first insulating layer.

BRIEF DESCRIPTION OF DRAWINGS

The above and other aspects, features, and advantages of the present disclosure will be more clearly understood from the following detailed description taken in conjunction with the accompanying drawings.

DETAILED DESCRIPTION

Hereinafter, exemplary embodiments of the present disclosure will be described in detail with reference to the accompanying drawings. Further, these embodiments are provided so that this disclosure will be thorough and complete, and will fully convey the scope of the disclosure to those skilled in the art. It should be understood that the various embodiments of the present disclosure are different, but need not be mutually exclusive. For example, certain features, structures, and characteristics described herein may be implemented in other exemplary embodiments without departing from the spirit and the scope of the present disclosure in connection with an exemplary embodiment. In addition, it is also to be understood that the position or disposition of individual components within each disclosed exemplary embodiment may be varied without departing from the spirit and the scope of the present disclosure.

Electronic Device

Figure 1:
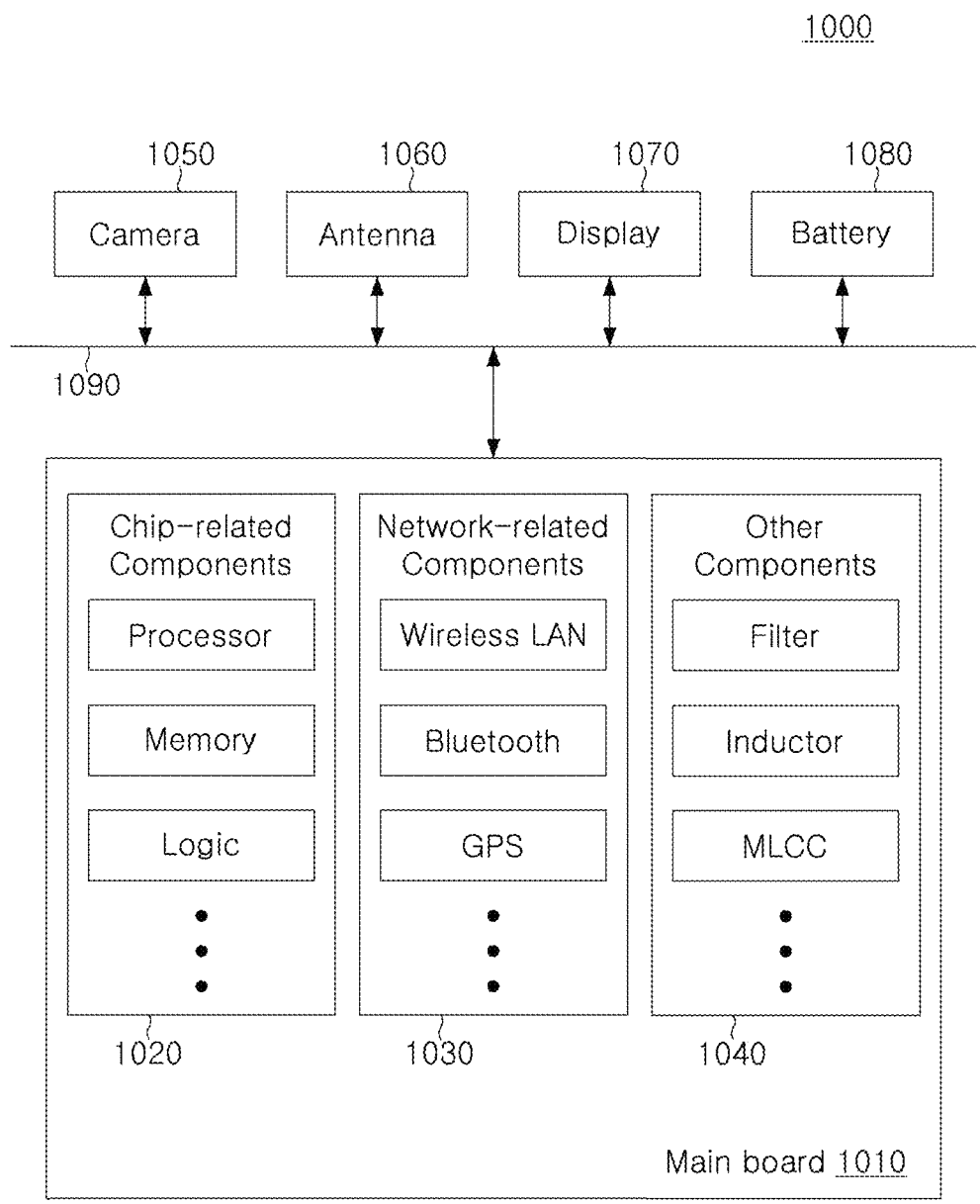
FIG. 1 is a block diagram schematically illustrating an example of an electronic device system.

FIG. 1 is a block diagram schematically illustrating an example of an electronic device system.

Referring to FIG. 1, an electronic device 1000 may accommodate a main board 1010. The main board 1010 may include chip-related components 1020, network-related components 1030, other components 1040, or the like, physically or electrically connected thereto. These components may be connected to others to be described below to form various signal lines 1090.

The chip-related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital converter, an application-specific integrated circuit (ASIC), or the like, or the like. However, the chip-related components 1020 are not limited thereto, and may include other types of chip-related components. In addition, the chip-related components 1020 may be combined with each other. The chip-related components 1020 may be in the form of a package including the chips or electronic components described above.

The network-related components 1030 may include protocols such as wireless fidelity (Wi-Fi) (Institute of Electrical And Electronics Engineers (IEEE) 802.11 family, or the like), worldwide interoperability for microwave access (WiMAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth®, 3G, 4G, and 5G protocols, and any other wireless and wired protocols, designated after the abovementioned protocols. However, the network-related components 1030 are not limited thereto, and may also include a variety of other wireless or wired standards or protocols. In addition, the network-related components 1030 may be combined with each other, together with the chip-related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, and may also include passive components used for various other purposes, or the like. In addition, other components 1040 may be combined with each other, together with the chip-related components 1020 or the network-related components 1030 described above.

Depending on a type of the electronic device 1000, the electronic device 1000 includes other components that may or may not be physically or electrically connected to the main board 1010. These other components may include, for example, a camera 1050, an antenna 1060, a display 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, and may be any other electronic device able to process data.

Figure 2:
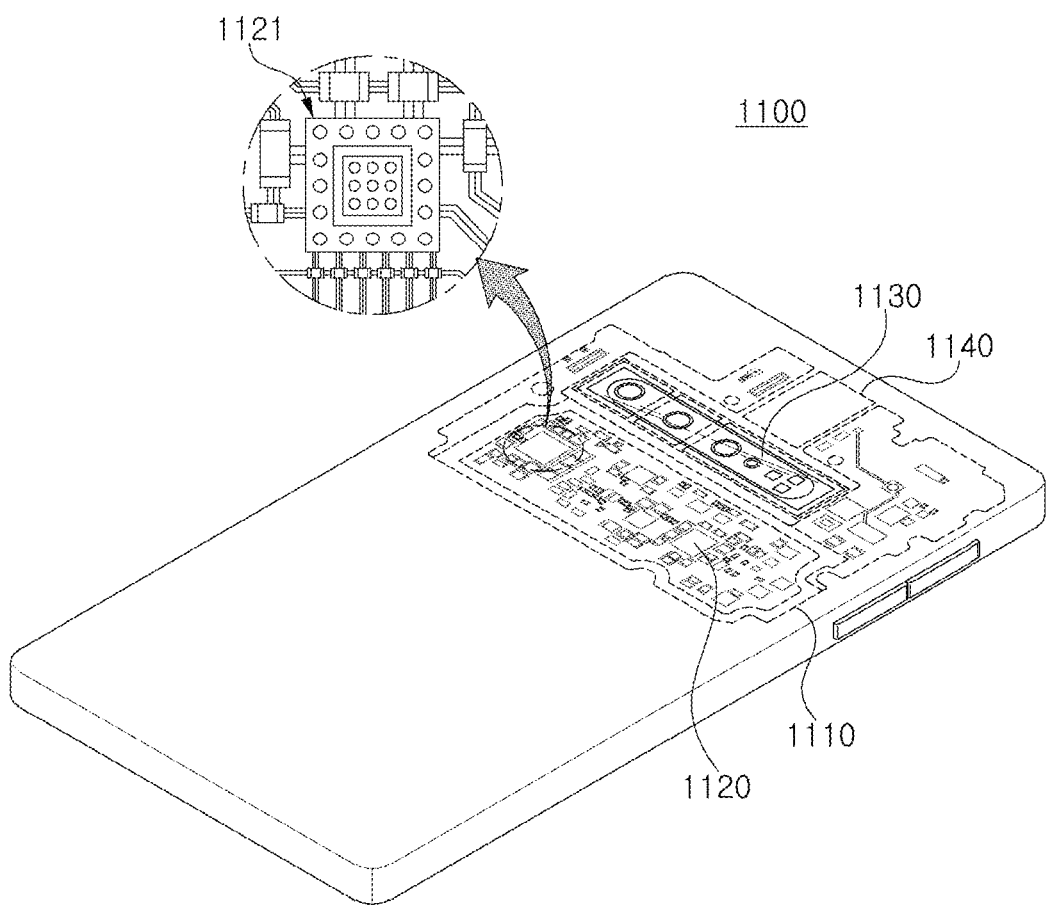
FIG. 2 is a perspective view schematically illustrating an example of an electronic device.

FIG. 2 is a perspective view schematically illustrating an example of an electronic device.

Referring to FIG. 2, an electronic device may be, for example, a smartphone 1100. A motherboard 1110 is accommodated inside the smartphone 1100, and various components 1120 are physically and/or electrically connected to the motherboard 1110. In addition, other components that may or may not be physically and/or electrically connected to the motherboard 1110 are accommodated therein, such as the camera module 1130 and/or the speaker 1140. A portion of the component 1120 may be the aforementioned chip-related component, for example, a component package 1121, but an embodiment thereof is not limited thereto. The component package 1121 may be in a form of a printed circuit board on which an electronic component including an active component and/or a passive component are surface-mounted. Alternatively, the component package 1121 may be in a form of a printed circuit board in which an active component and/or a passive component are embedded. Meanwhile, the electronic device is not necessarily limited to the smartphone 1100, and may be other electronic devices as described above.

Printed Circuit Board

Figure 3:
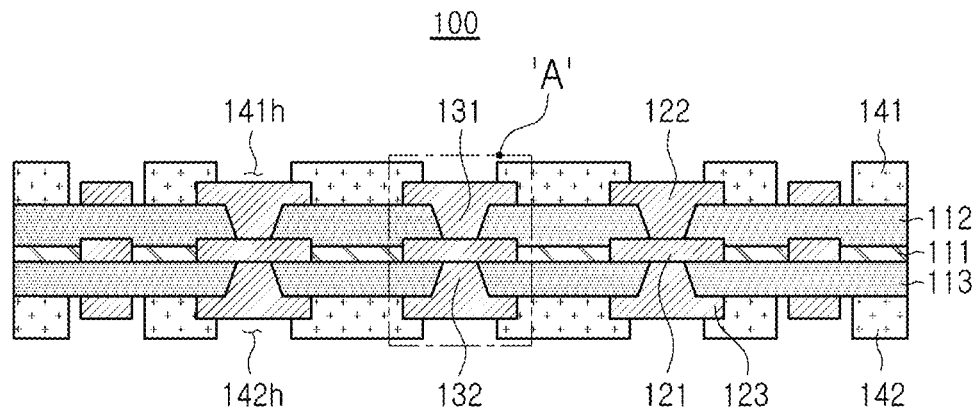
FIG. 3 is a schematic cross-sectional view of an example of a printed circuit board.

FIG. 3 is a cross-sectional view schematically illustrating an example of a printed circuit board.

Figure 4:
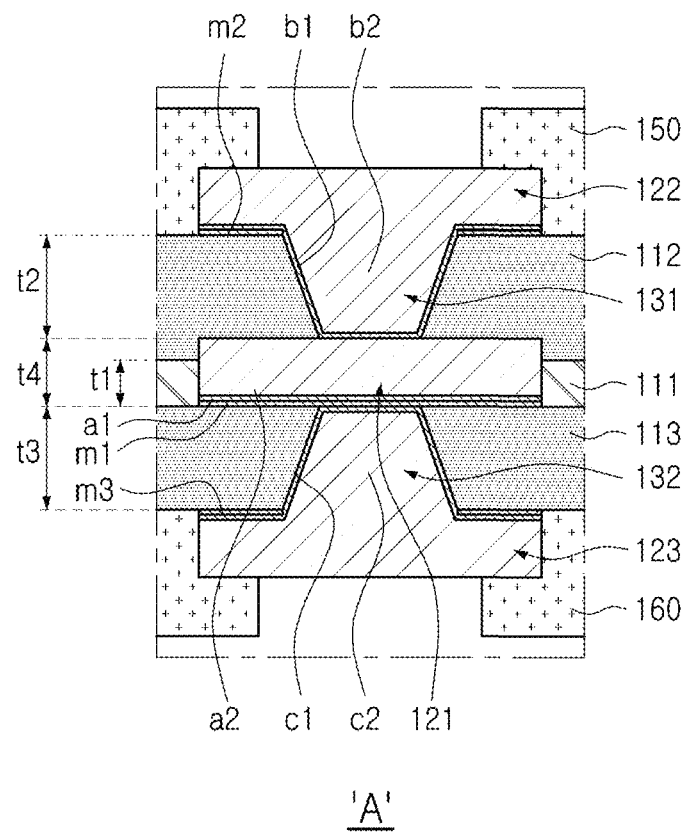
FIG. 4 is a schematic enlarged view of an example of area A of FIG. 3.

FIG. 4 is a schematic enlarged view of an example of area A of FIG. 3.

Referring to FIGS. 3 and 4, a printed circuit board 100 according to an example may include: first to third insulating layers 111, 112, and 113 and first to third interconnection layers 121, 122, and 123, and first and second connection vias 131 and 132 and first and second resist layers 141 and 142. For example, the printed circuit board according to an example may be a multilayer substrate.

Meanwhile, the first interconnection layer 121 may include a pattern buried in the first and second insulating layers 111 and 112. For example, the first insulating layer 111 may cover at least a portion of a side surface of the first interconnection layer 121, and the second insulating layer 112 may cover at least a portion of an upper surface of the first interconnection layer 121 and the first insulating layer 111. In addition, a lower surface of the first interconnection layer 121 may be exposed from a lower surface of the first insulating layer 111, and the third insulating layer 113 may cover at least a portion of each of the lower surface of the first interconnection layer 121 and the lower surface of the first insulating layer 111. As described above, when a side surface of the first interconnection layer 121 is covered using a separate first insulating layer 111, it is possible to prevent occurrence of voids near a bottom surface of the first interconnection layer 121 due to insufficient resin, such as epoxy, or the like. In addition, by stacking the second and third insulating layers 112 and 113 on both sides of the first insulating layer 111, a multilayer substrate having sufficient rigidity can be provided.

Meanwhile, the first and second insulating layers 111 and 112 may include different insulating materials. In addition, the first and third insulating layers 111 and 113 may include different insulating materials. In addition, the second and third insulating layers 112 and 113 may include the same type of insulating material. For example, the first insulating layer 111 may include an insulating material, not including a reinforcing material, and each of the second and third insulating layers 112 and 113 may include an insulating material including a reinforcing material. Here, the reinforcing material is included to maintain rigidity, and may be, for example, glass fiber (Glass Fiber, Glass Cloth, and/or Glass Fabric), but an embodiment thereof is not limited thereto. More specifically, the first insulating layer 111 may include solder resist, and each of the second and third insulating layers 112 and 113 may include prepreg, but an embodiment thereof is not limited thereto. As described above, an insulating material, not including a reinforcing material as a material of the first insulating layer 111, covering a side surface of the first interconnection layer 121, it is possible to more effectively prevent the occurrence of voids near a bottom surface of the first interconnection layer 121 due to insufficient resin such as epoxy, or the like. In addition, when an insulating material including a reinforcing material is used as a material for the second and third insulating layers 112 and 113 laminated on both sides of the first insulating layer 111, sufficient rigidity may be provided to the substrate even with a thin thickness, so it can be more advantageous for warpage control.

Meanwhile, a thickness t1 of the first insulating layer 111 may be thinner than a thickness t2 of the second insulating layer 112. In one example, the thickness t1 of the first insulating layer 111 may be thinner than a thickness t2 of a portion of the second insulating layer 112 disposed on the first interconnection layer 121. Also, the thickness t1 of the first insulating layer 111 may be thinner than a thickness t3 of the third insulating layer 113. More preferably, the thickness t1 of the first insulating layer 111 may be thinner than a thickness t4 of the first interconnection layer 121. For example, an upper surface of the first interconnection layer 121 may protrude onto an upper surface of the first insulating layer 111. Thus, the first insulating layer 111 may cover a portion of a side surface of the first interconnection layer 121, and the second insulating layer 112 may cover the other portion of the side surface of the first interconnection layer 121. Here, the thickness may mean an average thickness. The thickness may be measured by imaging a cut cross-section of the printed circuit board 100 with a scanning microscope, and the average thickness may be an average value of thicknesses measured at five arbitrary points. As described above, when the first insulating layer 111 is formed only to an extent of preventing the occurrence of voids, and the second and third insulating layers 112 and 113 are formed to a sufficient thickness, it may be effective to simultaneously achieve occurrence of voids and warpage control. In addition, since both the first and second insulating layers 111 and 112 may be in contact with the side surface of the first interconnection layer 121, a higher degree of reliability may be obtained.

Meanwhile, the first to third interconnection layers 121, 122, and 123 may include first to third seed layers a1, b1, and c1, formed by electroless plating, respectively, and first to third plating layers a2, b2, and c2 formed on the first to third seed layers a1, b1, and c1, by electrolytic plating, respectively. If necessary, the first to third interconnection layers 121, 122, and 123 may further include first to third copper foil layers m1, m2, and m3, respectively, and the first to third seed layers a1, b1, and c1 may be disposed between the first to third copper foil layers m1, m2, and m3 and the first to third plating layers a2, b2, and c2, respectively. The first and second connection vias 131 and 132, which may be formed together with the second and third interconnection layers 122 and 123, respectively, may include second and third seed layers b1 and c1 formed by electroless plating, respectively, and second and third plating layers b2 and c2 formed by electrolytic plating. As described above, in the printed circuit board 100 according to an example, all of the first to third interconnection layers 121, 122, and 123 may be formed by a semi-additive process (SAP) or a modified additive process (MSAP), and thus may be more advantageous for fine patterning.

Meanwhile, a lower surface of the first interconnection layer 121 may be substantially coplanar with a lower surface of the first insulating layer 111. Here, being substantially coplanar may mean that one surface of both sides is located at almost the same level within a process error range. In this case, it is possible to secure a constant insulation distance between patterns, and thus more excellent reliability may be obtained.

Meanwhile, the second interconnection layer 122 may be disposed on an upper surface of the second insulating layer 112. Here, being disposed on the upper surface may include being disposed on the upper surface in a protruding pattern or being disposed on the upper surface in a buried pattern. When disposed in a buried pattern, an upper surface of the second interconnection layer 122 may be exposed from the upper surface of the second insulating layer 112.

Meanwhile, the third interconnection layer 123 may be disposed on a lower surface of the third insulating layer 113. Here, being disposed on the lower surface may include being disposed on the lower surface in a protruding pattern or disposed on the lower surface in a buried pattern. When disposed in a buried pattern, a lower surface of the third interconnection layer 123 may be exposed from the lower surface of the third insulating layer 113.

Hereinafter, the components of the printed circuit board 100 according to an example will be described in more detail with reference to the drawings.

Each of the first to third insulating layers 111, 112, and 113 may include an insulating material. The insulating material may include a thermosetting resin such as an epoxy resin, a thermoplastic resin such as polyimide, or a material containing an inorganic filler, an organic filler, and/or a glass fiber (Glass Fiber, Glass Cloth, Glass Fabric), together with these resins. The insulating material may be a photosensitive material and/or a non-photosensitive material. For example, solder resist (SR), or the like may be used as an insulating material for the first insulating layer 111, but an embodiment thereof is not limited thereto, and other polymer materials that may be applied to other thinning processes may be used. In addition, as the insulating material of the second and third insulating layers 112 and 113, an insulation material such as prepreg (PPG), resin coated copper (RCC), and an insulation material such as copper clad laminate (CCL), and the like, may be used, but an embodiment thereof is not limited thereto, and other polymer materials having excellent rigidity may be used.

Each of the first to third interconnection layers 121, 122, and 123 may include a metal material. The metal material may include copper (Cu), aluminum (Al), silver (Ag), tin (Sn), gold (Au), nickel (Ni), lead (Pb), titanium (Ti), and/or alloys thereof. Each of the first to third interconnection layers 121, 122, and 123 may perform various functions according to design. For example, it may include a ground pattern, a power pattern, a signal pattern, and the like. Here, the signal pattern may include a pattern providing an electrical path for various signals other than ground and power, for example, a data signal. These patterns may include a line pattern, a plane pattern, and/or a pad pattern, respectively. Each of the first to third interconnection layers 121, 122, and 123 may include an electroless plating layer (or chemical copper) and an electrolytic plating layer (or electrolytic copper). Alternatively, it may include a metal foil (or copper foil) and an electrolytic plating layer (or electrolytic copper). Alternatively, a metal foil (or copper foil), an electroless plating layer (or chemical copper), and an electrolytic plating layer (or electrolytic copper) may be included. A sputter layer may be included instead of the electroless plating layer (or chemical copper), and both may be included if necessary.

Each of the first and second connection vias 131 and 132 may include a metal material. The metal material may include copper (Cu), aluminum (Al), silver (Ag), tin (Sn), gold (Au), nickel (Ni), lead (Pb), titanium (Ti), and/or alloys thereof. Each of the first and second connection vias 131 and 132 may perform various functions according to design. For example, it may include ground vias, power vias, signal vias, and the like. Here, the signal vias may include vias for electrically connecting various signals other than ground and power, for example, data signals. The first and second connection vias 131 and 132 may have tapered shapes in opposite directions. For example, the first connection via 131 may have a tapered shape in which a width of a lower side thereof connected to the first interconnection layer 121 is narrower than a width of an upper side thereof connected to the second interconnection layer 122 in cross section. In addition, the second connection via 132 may have a tapered shape in which the width of the upper side thereof connected to the first interconnection layer 121 is narrower than the width of the lower side thereof connected to the third interconnection layer 123 in cross section. Each of the first and second connection vias 132 and 132 may be formed through the same plating process as the second and third interconnection layers 122 and 123, and may be integrated, but an embodiment thereof is not limited thereto. Each of the first and second connection vias 131 and 132 may include an electroless plating layer (or chemical copper) and an electrolytic plating layer (or electrolytic copper). A sputter layer may be included instead of the electroless plating layer (or chemical copper), and both may be included if necessary.

Each of the first and second resist layers 141 and 142 may include an insulating material. The insulating material may include a thermosetting resin such as an epoxy resin, or a material including an inorganic filler and/or an organic filler together with such a resin. The insulating material may be a photosensitive material and/or a non-photosensitive material. For example, solder resist (SR), or the like may be used as an insulating material for the first and second resist layers 141 and 142, but an embodiment thereof is not limited thereto, and various polymer materials that may be used as the outermost layer material of the substrate may be used. The first and second resist layers 141 and 142 may have a plurality of first and second openings 141h and 142h opening at least a portion of the second and third interconnection layers 122 and 123, respectively. Each of the plurality of first and second openings 141h and 142h is a solder mask defined type (SMD-type) and/or non-solder mask defined type (NSMD-type), and may expose at least a portion of the second and third interconnection layers 122 and 123, respectively.

FIGS. 5 to 12 are process diagrams schematically illustrating an example of manufacturing the printed circuit board of FIG. 3.

Figure 5:
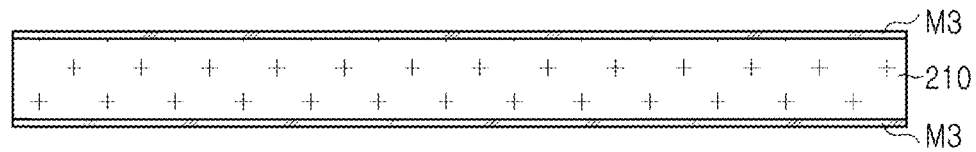
FIGS. 5 to 12 are process diagrams schematically illustrating an example of manufacturing the printed circuit board of FIG. 3.

Referring to FIG. 5, a detach core in which a metal foil, for example, a third copper foil M3 is laminated on an upper and/or a lower surface of an insulating material 210 is prepared. For example, a copper clad laminate (CCL) may be used, but an embodiment thereof is not limited thereto, and various detach cores used in a coreless process may be used.

Figure 6:
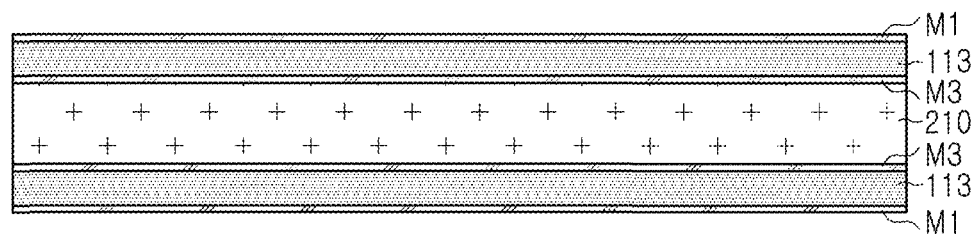

Referring to FIG. 6, a third insulating layer 113 is laminated on the third copper foil M3. The third insulating layer 113 may be formed by laminating prepreg (PPG), resin coated copper (RCC), or the like, and may have a metal foil, for example, a first copper foil M1 laminated on an upper or a lower surface thereof.

Figure 7:
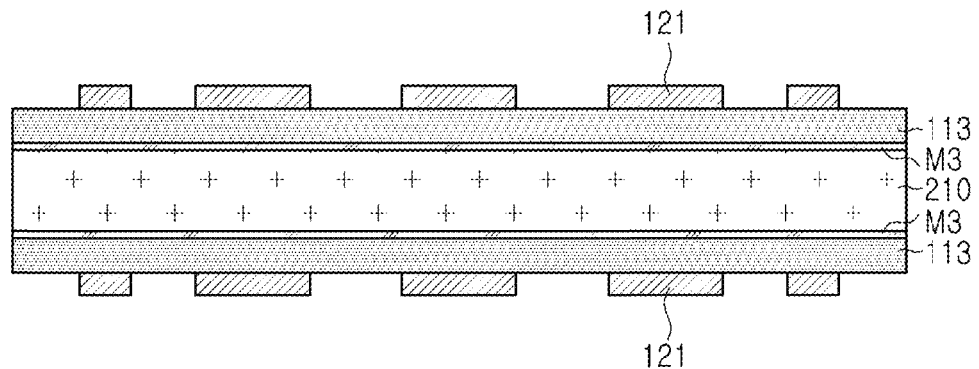

Referring to FIG. 7, a first interconnection layer 121 is formed. The first interconnection layer 121 may be formed by a Semi Additive Process (SAP) or a Modified Additive Process (MSAP) using a plating process. For example, a seed layer may be formed on a first copper foil M1 by electroless plating, a photoresist may be formed on the seed layer, the photoresist may be patterned by an exposure and development process, and then the patterned region may be filled with electroplating, and may be formed by peeling off the photoresist. If necessary, the seed layer or the first copper foil M1 may be omitted. The first copper foil M1 may remain on the first interconnection layer 121 as a first copper foil layer m1 after etching.

Figure 8:
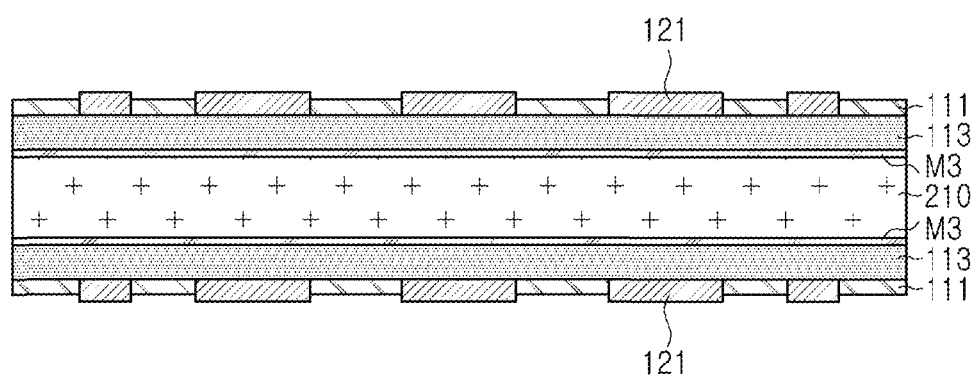

Referring to FIG. 8, a first insulating layer 111 burying the first interconnection layer 121 is formed on a third insulating layer 113. The first insulating layer 111 may be formed by, for example, applying solder resist. Thereafter, a thickness of the first insulating layer 111 is made to be thinner than a thickness of the first interconnection layer 121. For example, a thinning process may be used. Therethrough, the first insulating layer 111 may cover a portion of a side surface of the first interconnection layer 121, and an upper surface of the first interconnection layer 121 may protrude onto an upper surface of the first insulating layer 111.

Figure 9:
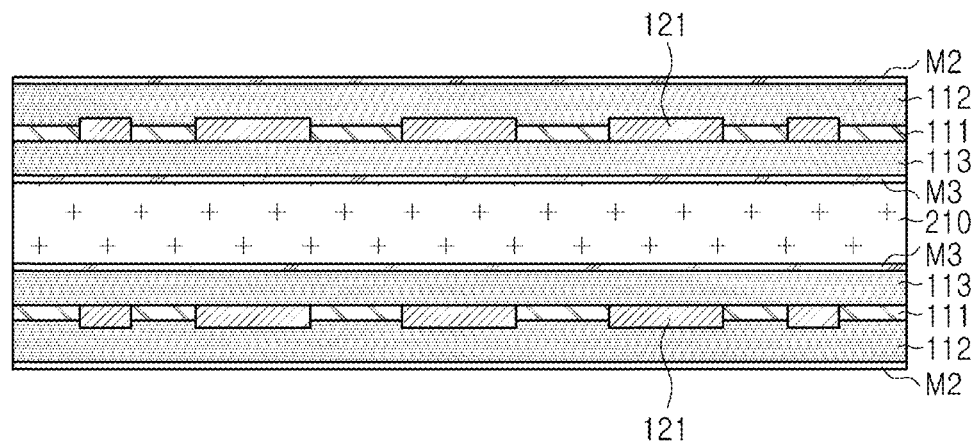

Referring to FIG. 9, a second insulating layer 112 is formed on the first insulating layer 111 and the first interconnection layer 121. The second insulating layer 112 may be formed by laminating prepreg (PPG), resin coated copper (RCC), or the like, and may be formed by laminating a metal foil, for example, a second copper foil M2 on an upper surface or a lower surface thereof. The second insulating layer 112 may cover an upper surface of each of the first insulating layer 111 and the first interconnection layer 121, and may cover the other portion of a side surface of the first interconnection layer 121.

Figure 10:
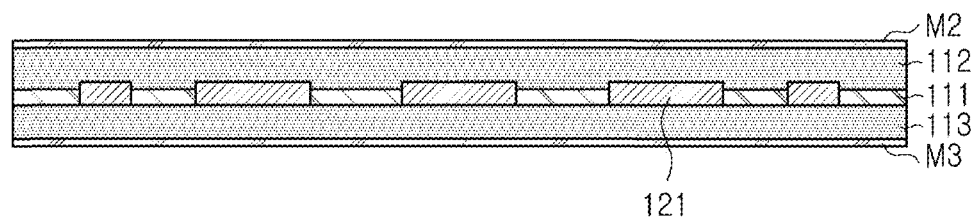

Referring to FIG. 10, a structure manufactured through the above-described process is separated from a detach core. For example, a third copper foil M3 may be peeled off from the insulating material 210.

Figure 11:
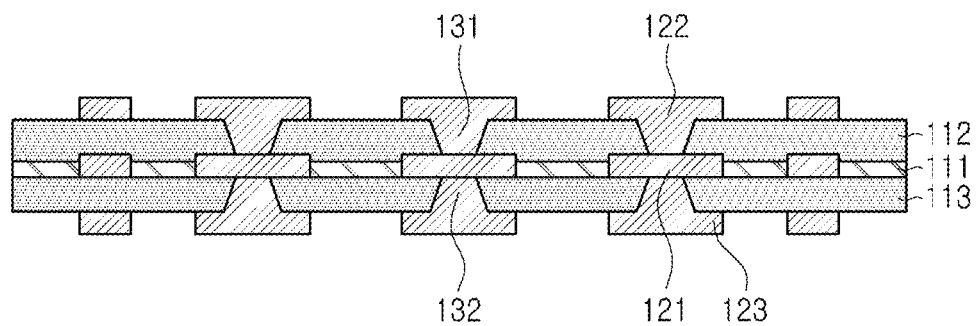

Referring to FIG. 11, second and third interconnection layers 122 and 123 are formed. In addition, first and second connection vias 131 and 132 are formed. The second and third interconnection layers 122 and 123 and the first and second connection vias 131 and 132 may be formed by a semi additive process (SAP) or a modified additive process (MSAP) using a plating process. For example, they may be formed by forming a via hole in the second and third insulating layers 112 and 113 by laser processing, or the like, forming a seed layer on second and third copper foils M2 and M3 and the via hole by electroless plating, forming a photoresist on the seed layer, patterning the photoresist through an exposure and developing process, and then filling the patterned region and via hole with electrolytic plating and then peeling off the photoresist. If necessary, the seed layer or the second and third copper foils M2 and M3 may be omitted. The second and third copper foils M2 and M3 may remain on the second and third interconnection layers 122 and 123 as second and third copper foil layers m2 and m3 after etching.

Figure 12:
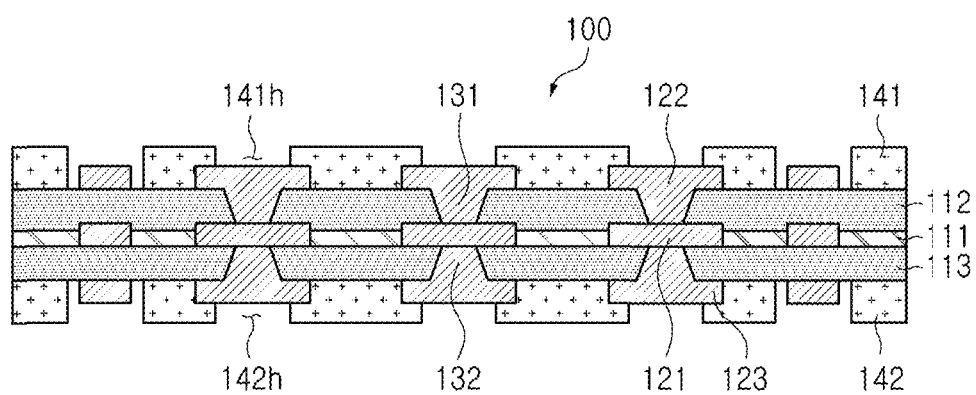

Referring to FIG. 12, first and second resist layers 141 and 142 are formed on the second and third insulating layers 112 and 113. The first and second resist layers 141 and 142 may be formed by applying a solder resist, but an embodiment thereof is not limited thereto. Thereafter, first and second openings 141h and 142h are formed in the first and second resist layers 141 and 142, respectively, through a photolithography process or the like. Through a series of processes, the printed circuit board 100 according to the above-described example may be formed. Other overlapping contents thereof are omitted.

Figure 13:
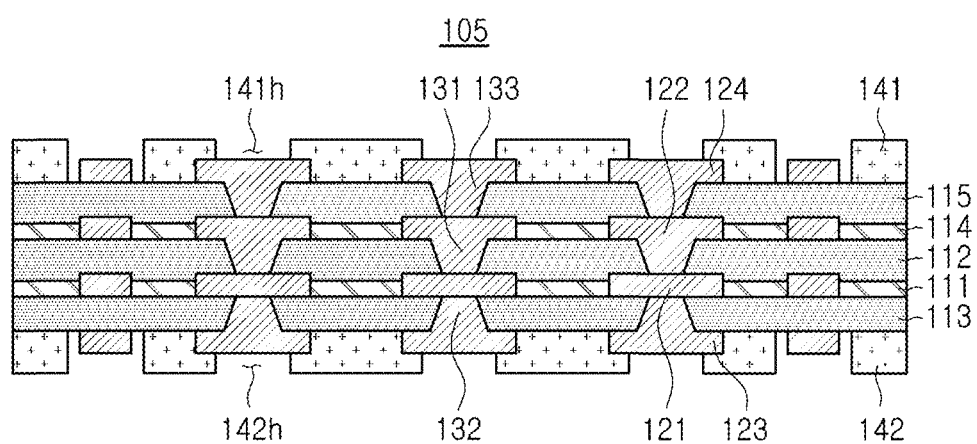
FIG. 13 is a schematic cross-sectional view of another example of a printed circuit board.

FIG. 13 is a cross-sectional view illustrating another example of a printed circuit board.

Referring to FIG. 13, a printed circuit board 105 according to another example may include first to fifth insulating layers 111, 112, 113, 114, and 115 and first to fourth interconnection layers 121, 122, 123, and 124, and first to third connection vias 131, 132, and 133 and first and second resist layers 141 and 142. For example, the printed circuit board 105 according to another example may have a more multilayer structure than the printed circuit board 100 according to the above-described example.

Meanwhile, the second interconnection layer 122 may include a pattern buried in the fourth and fifth insulating layers 114 and 115. For example, the fourth insulating layer 114 may cover at least a portion of a side surface of the second interconnection layer 122, and the fifth insulating layer 115 may cover at least a portion of each of an upper surface of the second interconnection layer 122 and an upper surface of the fourth insulating layer 114. In addition, a lower surface of the second interconnection layer 122 may be exposed from a lower surface of the fourth insulating layer 114, and the second insulating layer 112 may cover at least a portion of each of the lower surface of the second interconnection layer 122 and the lower surface of the fourth insulating layer 114. As described above, when a side surface of the second interconnection layer 122 is covered using a separate fourth insulating layer 114, it is possible to prevent voids due to insufficient resin such as epoxy from occurring near a bottom surface of the second interconnection layer 122. In addition, by stacking the fifth insulating layer 115 on the fourth insulating layer 114, a multilayer substrate having sufficient rigidity may be provided.

Meanwhile, the fourth and fifth insulating layers 114 and 115 may include different insulating materials. In addition, the second and fourth insulating layers 112 and 114 may include different insulating materials. In addition, the second and fifth insulating layers 112 and 115 may include the same type of insulating material. For example, the fourth insulating layer 114 may include an insulating material, not including a reinforcing material, and the fifth insulating layer 115 may include an insulating material including a reinforcing material. Here, the reinforcing material is included to maintain rigidity, and may be, for example, glass fiber (Glass Fiber, Glass Cloth, and/or Glass Fabric), but an embodiment thereof is not limited thereto. More specifically, the fourth insulating layer 114 may include solder resist, and the fifth insulating layer 115 may include prepreg, but an embodiment thereof is not limited thereto. As described above, when an insulating material, not including a reinforcing material is used as a material for the fourth insulating layer 114 covering the side surface of the second interconnection layer 122, the occurrence of voids near the bottom surface of the second interconnection layer 122 due to insufficient resin such as epoxy may be more effectively prevented. In addition, when an insulating material including a reinforcing material is used as a material for the fifth insulating layer 115 stacked on the fourth insulating layer 114, sufficient rigidity may be provided to a substrate even with a thin thickness, which is more advantageous in controlling warpage.

Meanwhile, a thickness of the fourth insulating layer 114 may be thinner than that of the fifth insulating layer 115. Also, the thickness of the fourth insulating layer 114 may be thinner than that of the second insulating layer 112. More preferably, the thickness of the fourth insulating layer 114 may be thinner than that of the second interconnection layer 122. For example, an upper surface of the second interconnection layer 122 may protrude onto an upper surface of the fourth insulating layer 114. Accordingly, the fourth insulating layer 114 may cover a portion of a side surface of the second interconnection layer 122, and the fifth insulating layer 115 may cover the other portion of the side surface of the second interconnection layer 122. Here, the thickness may mean an average thickness. The thickness may be measured by photographing a cut cross-section of the printed circuit board 105 with a scanning microscope, and an average thickness may be an average value of thicknesses measured at five random points. As described above, when the fourth insulating layer 114 is formed only enough to prevent the occurrence of voids, and the fifth insulating layer 115 is formed to a sufficient thickness, it can be effective to simultaneously achieve occurrence of voids and warpage control. Also, since the fourth and fifth insulating layers 114 and 115 may all come into contact with the side surface of the second interconnection layer 122, more improved reliability may be obtained.

Meanwhile, the fourth interconnection layer 124 may include a fourth seed layer formed by electroless plating and a fourth plating layer formed on the fourth seed layer by electrolytic plating. If necessary, the fourth interconnection layer may further include a fourth copper foil layer, and the fourth seed layer may be disposed between the fourth copper foil layer and the fourth plating layer. The third connection via 133 that may be formed together with the fourth interconnection layer 124 may also include a fourth seed layer formed by electroless plating and a fourth plating layer formed by electrolytic plating. As above, in the printed circuit board 105 according to another example, all of the first to fourth interconnection layers 121, 122, 123, and 124 may be formed by a semi additive process (SAP) or a modified additive process (MSAP). Therefore, it may be more advantageous for fine patterning.

Meanwhile, the lower surface of the second interconnection layer 122 may be substantially coplanar with the lower surface of the fourth insulating layer 114. Here, being substantially coplanar may mean that one surface of both sides is located at almost the same level within a process error range. In this case, it is possible to secure a constant insulation distance between patterns, and thus more excellent reliability may be obtained.

Meanwhile, the fourth interconnection layer 124 may be disposed on an upper surface of the fifth insulating layer 115. Here, being disposed on an upper surface may include being disposed on the upper surface in a protruding pattern or being disposed on the upper surface in a buried pattern. When disposed in a buried pattern, the upper surface of the fourth interconnection layer 124 may be exposed from the upper surface of the fifth insulating layer 115.

Hereinafter, components of a printed circuit board 105 according to another example will be described in more detail with reference to the drawings.

Each of the fourth and fifth insulating layers 114 and 115 may include an insulating material. The insulating material may include a thermosetting resin such as epoxy resins, a thermoplastic resin such as polyimide, or a material containing an inorganic filler, an organic filler, and/or a glass fiber (glass cloth, and/or glass fabric), together with these resins. The insulating material may be a photosensitive material and/or a non-photosensitive material. For example, solder resist (SR), or the like may be used as the insulating material for the fourth insulating layer 114, but an embodiment thereof is not limited thereto, and other polymer materials to which other thinning processes may be applied may be used. In addition, as the insulating material of the fifth insulating layer 115, prepreg (PPG), an insulating material of resin coated copper (RCC), an insulating material of copper clad laminate (CCL), and the like may be used, but an embodiment thereof is not limited thereto, and other polymer materials having excellent rigidity may also be used.

The fourth interconnection layer 124 may include a metal material. The metal material may include copper (Cu), aluminum (Al), silver (Ag), tin (Sn), gold (Au), nickel (Ni), lead (Pb), titanium (Ti), and/or alloys thereof. The fourth interconnection layer 124 may perform various functions depending on the design. For example, the fourth interconnection layer 124 may include a ground pattern, a power pattern, a signal pattern, and the like. Here, the signal pattern may include a pattern providing an electrical path for various signals other than ground and power, for example, a data signal, or the like. Each of these patterns may include a line pattern, a plane pattern, and/or a pad pattern. The fourth interconnection layer 124 may include an electroless plating layer (or chemical copper) and an electrolytic plating layer (or electrolytic copper). Alternatively, it may include a metal foil (or copper foil) and an electrolytic plating layer (or electrolytic copper). A sputter layer may be included instead of the electroless plating layer (or chemical copper), and both may be included if necessary.

The third connection via 133 may include a metal material. The metal material may include copper (Cu), aluminum (Al), silver (Ag), tin (Sn), gold (Au), nickel (Ni), lead (Pb), titanium (Ti), and/or alloys thereof. The third connection via 133 may perform various functions depending on the design. For example, the third connection via 133 may include ground vias, power vias, signal vias, and the like. Here, the signal vias may include vias for electrically connecting various signals other than ground and power, for example, data signals, or the like. The third connection via 133 may have a tapered shape in which a width of a lower side connected to the second interconnection layer 122 is narrower than a width of an upper side thereof connected to the fourth interconnection layer 124 in cross-section. The third connection via 133 may be formed through the same plating process as the fourth interconnection layer 124, and they may be integrated, but an embodiment thereof is not limited thereto. The third connection via 133 may include an electroless plating layer (or chemical copper) and an electrolytic plating layer (or electrolytic copper). A sputter layer may be included instead of the electroless plating layer (or chemical copper), and both may be included if necessary.

Other contents are substantially the same as those described in the printed circuit board 100 according to the above-described example, and unless contradictory, the description of the printed circuit board 100 according to one example described above may also be applied to the printed circuit board 105 according to another example. In addition, a manufacturing example may also be substantially the same as the manufacturing example described above, and only a build-up process may be added. Therefore, a detailed description of the overlapping contents will be omitted.

If necessary, a build-up process may be additionally performed on the fifth insulating layer 115. In this case, the contents additionally described in the printed circuit board 105 according to another example described above may be substantially equally applied to an insulating layer, an interconnection layer, and a connection via formed through the build-up process. For example, a substantially identical structure may be repeatedly built up, and the specific number of layers may vary depending on the design.

In the present disclosure, the meaning of "in a cross-section" may mean a cross-sectional shape when an object is vertically cut, or a cross-sectional shape when the object is viewed from a side-view. In addition, the meaning of "on a plane" may be a shape when the object is horizontally cut, or a planar shape when the object is viewed from a top-view or a bottom-view.

In the present disclosure, a lower side, a lower portion, a lower surface, and the like, may be used to mean a direction toward a mounting space of a semiconductor package including an organic interposer, based on a cross-section of the drawing for convenience, and an upper side, an upper portion, an upper surface, and the like may be used to mean a direction opposite thereto. However, this is defined as a direction for convenience of explanation, and the scope of the claims is not particularly limited by the description of this direction.

As used herein, the term "connected" may not only refer to "directly connected" but also include "indirectly connected" by means of an adhesive layer, or the like. The term "electrically connected" may include both of the case in which constitutional elements are "physically connected" and the case in which constitutional elements are "not physically connected." Further, the terms "first," "second," and the like may be used to distinguish one constitutional element from the other, and may not limit a sequence and/or an importance, or others, in relation to the constitutional elements. In some cases, a first constitutional element may be referred to as a second constitutional element, and similarly, a second constitutional element may be referred to as a first constitutional element without departing from the scope of right of the exemplary embodiments.

As used herein, the term "an embodiment" is provided to emphasize a particular feature, structure, or characteristic, and does not necessarily refer to the same embodiment. Furthermore, the particular characteristics or features may be combined in any suitable manner in one or more embodiments. For example, a context described in a specific exemplary embodiment may be used in other embodiments, even if it is not described in the other embodiments, unless it is described contrary to or inconsistent with the context in the other embodiments.

The terms used herein describe particular embodiments only, and the present disclosure is not limited thereby. As used herein, the singular forms "a," "an," and "the" are intended to include the plural forms as well, unless the context clearly indicates otherwise.

As set forth above, as one of the various effects of the present disclosure, a multilayer substrate capable of preventing void defects even when a thin material including glass is used, may be provided.

While exemplary embodiments have been shown and described above, it will be apparent to those skilled in the art that modifications and variations could be made without departing from the scope of the present invention as defined by the appended claims.

What is claimed is:

1. A printed circuit board, comprising:
   a first interconnection layer;
   a first insulating layer covering at least a portion of a side surface of the first interconnection layer;
   a second insulating layer covering at least a portion of an upper surface of the first interconnection layer and at least a portion of an upper surface of the first insulating layer;
   a third insulating layer covering at least a portion of a lower surface of the first interconnection layer and at least a portion of a lower surface of the first insulating layer;
   a second interconnection layer disposed on an upper surface of the second insulating layer;
   a third interconnection layer disposed on a lower surface of the third insulating layer;
   a fourth insulating layer covering at least a portion of a side surface of the second interconnection layer;

a fifth insulating layer covering at least a portion of an upper surface of the second interconnection layer and at least a portion of an upper surface of the fourth insulating layer; and a fourth interconnection layer disposed on an upper surface of the fifth insulating layer, wherein the second insulating layer covers at least a portion of a lower surface of the second interconnection layer and at least a portion of a lower surface of the fourth insulating layer.

2. The printed circuit board of claim 1, wherein the first insulating layer comprises an insulating material, different from that of the second and third insulating layers.

3. The printed circuit board of claim 2, wherein among the first to third insulating layers, only the second and third insulating layers comprise a reinforcing material including a glass fiber.

4. The printed circuit board of claim 1, further comprising:

a third connection via penetrating through the fifth insulating layer, and connecting the second and fourth interconnection layers, wherein the third connection via has a tapered shape in which a width of an upper width thereof connected to the fourth interconnection layer is wider than a width of a lower width thereof connected to the second interconnection layer, in a cross-section.

5. The printed circuit board of claim 2, wherein the first insulating layer comprises solder resist, and each of the second and third insulating layers comprises prepreg.

6. The printed circuit board of claim 1, wherein the first insulating layer is thinner than each of the second and third insulating layers.

7. The printed circuit board of claim 1, wherein the first insulating layer is thinner than the first interconnection layer.

8. The printed circuit board of claim 7, wherein the first insulating layer covers a portion of a side surface of the first interconnection layer, and the second insulating layer covers the other portion of the side surface of the first interconnection layer.

9. The printed circuit board of claim 1, wherein the lower surface of the first interconnection layer is substantially coplanar with the lower surface of the first insulating layer.

10. The printed circuit board of claim 1, wherein each of the first to third interconnection layers comprises first to third seed layers and first to third plating layers respectively disposed on the first to third seed layers.

11. The printed circuit board of claim 10, wherein each of the first to third interconnection layers further comprises first to third copper foil layers, and each of the first to third seed layers is disposed between the first to third copper foil layers and the first to third plating layers.

12. The printed circuit board of claim 1, further comprising:

a first connection via penetrating through the second insulating layer, and connecting the first and second interconnection layers; and a second connection via penetrating through the third insulating layer, and connecting the first and third interconnection layers, wherein the first and second connection vias are tapered in opposite directions.

13. The printed circuit board of claim 1, further comprising:

a first resist layer disposed on an upper surface of the second insulating layer, the first resist layer having a first opening opening at least a portion of the second interconnection layer; and a second resist layer disposed on a lower surface of the third insulating layer, the second resist layer having a second opening opening at least a portion of the third interconnection layer.

14. The printed circuit board of claim 1, wherein the first insulating layer extends between side surfaces of patterns of the first interconnection layer and is spaced apart from respective upper surfaces of the patterns of the first interconnection layer.

15. A printed circuit board, comprising:

a first interconnection layer;

a first insulating layer covering a portion of a side surface of the first interconnection layer, and spaced apart from an upper surface of the first interconnection layer;

a second insulating layer disposed on an upper surface of the first insulating layer and the upper surface of the first interconnection layer, and covering at least a portion of the upper surface of the first interconnection layer and the other portion of a side surface thereof;

a third insulating layer disposed on a lower surface of the first insulating layer and a lower surface of the first interconnection layer, and covering at least a portion of the lower surface of the first interconnection layer;

a second interconnection layer disposed on an upper surface of the second insulating layer;

a fourth insulating layer covering at least a portion of a side surface of the second interconnection layer;

a fifth insulating layer covering at least a portion of an upper surface of the second interconnection layer and at least a portion of an upper surface of the fourth insulating layer; and a fourth interconnection layer disposed on an upper surface of the fifth insulating layer, wherein the second insulating layer covers at least a portion of a lower surface of the second interconnection layer and at least a portion of a lower surface of the fourth insulating layer, and wherein the upper surface of the first interconnection layer protrudes beyond the upper surface of the first insulating layer.

16. The printed circuit board of claim 15, wherein the lower surface of the first interconnection layer is substantially coplanar with the lower surface of the first insulating layer.

17. The printed circuit board of claim 15, wherein the first insulating layer comprises an insulating material, different from that of the second and third insulating layers.

18. The printed circuit board of claim 17, wherein among the first to third insulating layers, only the second and third insulating layers comprise a reinforcing material including a glass fiber.

19. The printed circuit board of claim 17, wherein the first insulating layer comprises solder resist, and each of the second and third insulating layers comprises prepreg.

* * * * *